(12) United States Patent
Kudo

(10) Patent No.: US 6,566,975 B2
(45) Date of Patent: May 20, 2003

(54) WIRING BOARD HAVING PARALLEL TRANSMISSION LINES TO TRANSMIT EQUIVALENT SIGNALS IN PARALLEL

(75) Inventor: Junichi Kudo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/939,684

(22) Filed: Aug. 28, 2001

(65) Prior Publication Data

US 2002/0039267 A1 Apr. 4, 2002

(30) Foreign Application Priority Data

Aug. 29, 2000 (JP) ........................................ 2000-258911

(51) Int. Cl.$^7$ .............................. H01P 3/08; H03H 7/38
(52) U.S. Cl. .......................................... 333/33; 333/246
(58) Field of Search .......................... 333/33, 238, 109, 333/236, 239, 1; 330/286, 382; 370/498, 531; 361/788; 365/97

(56) References Cited

U.S. PATENT DOCUMENTS

| | | | | |
|---|---|---|---|---|
| 3,671,951 A | * | 6/1972 | Lee ............................. | 365/97 |
| 4,891,616 A | * | 1/1990 | Renken et al. ............... | 333/236 |
| 5,027,088 A | * | 6/1991 | Shimizu et al. ............... | 333/1 |
| 5,530,623 A | * | 6/1996 | Sanwo et al. ............... | 361/788 |
| 5,982,256 A | * | 11/1999 | Uchimura et al. .......... | 333/239 |
| 6,496,886 B1 | | 12/2002 | Osaka et al. ................ | 710/100 |

FOREIGN PATENT DOCUMENTS

JP           6-216477           8/1994

* cited by examiner

*Primary Examiner*—Patrick Wamsley
(74) *Attorney, Agent, or Firm*—Oblon, Spivak, McClelland, Maier & Neustadt, P.C.

(57) ABSTRACT

A wiring board includes a signal transmission circuit designed as a distributed constant circuit. The signal transmission circuit includes a first transmission line connecting a first electric component and a second electric component, and a second transmission line connecting the second electric component to a terminator resistor of the distributed constant circuit. At least the first transmission line includes a plurality of signal lines arranged in parallel, which transmit a signal in parallel.

7 Claims, 4 Drawing Sheets

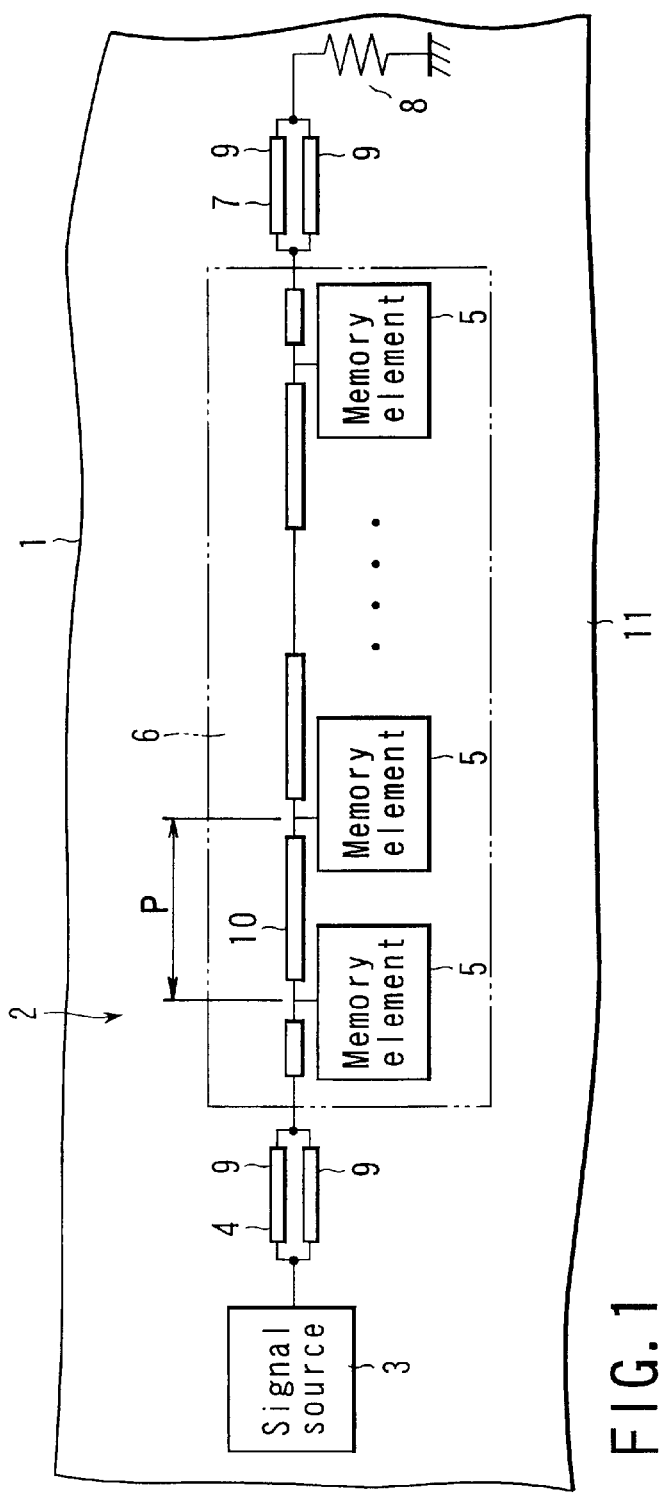
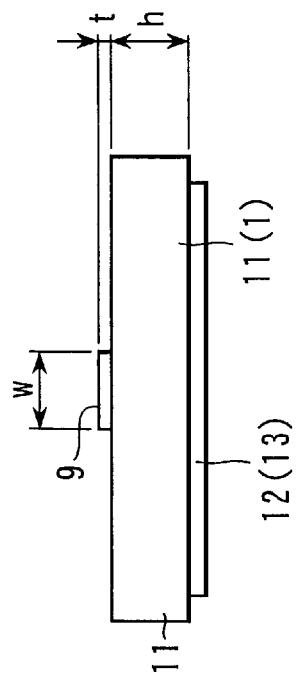
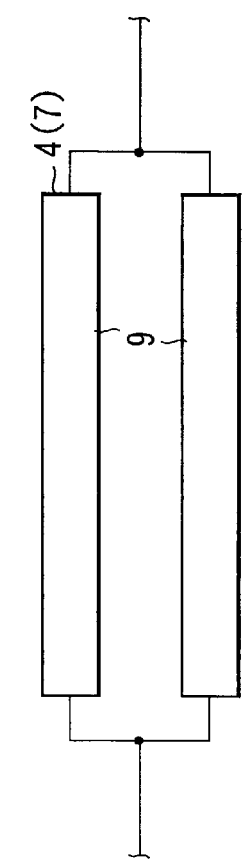

WIRING BOARD HAVING PARALLEL TRANSMISSION LINES TO TRANSMIT EQUIVALENT SIGNALS IN PARALLEL

CROSS-REFERENCE TO RELATED APPLICATIONS

This application is based upon and claims the benefit of priority from the prior Japanese Patent Application No. 2000-258911 filed Aug. 29, 2000, the entire contents of which are incorporated herein by reference.

BACKGROUND OF THE INVENTION

1. Field of the Invention

The present invention relates to a wiring board with a signal transmission circuit, which transmits a signal at high speed, and to electronic equipment using the wiring board.

2. Description of the Related Art

Electronic equipment used in the field of information technology, such as computers, may require a function to transmit a signal at high speed from a signal source comprising a DSP (Digital Signal Processor) or an MPU (Micro Processing Unit) to a memory element or from a memory element to an MPU or a logic LSI.

In the case where a signal transmission circuit for high-speed signal transmission is formed on a wiring board, a laminated board, for example, including a plurality of conductive layers made of copper and one or a plurality of insulating layers made of epoxy resin, is used as the wiring board.

In recent years, as the driving speed of the signal source is increased, the frequency of a signal transmitted on the wiring board of electronic equipment is also increased. Meanwhile, since the size of electronic equipment itself is reduced with each passing year, a wiring board in which the signal transmission circuit is designed as a distributed constant circuit has been required.

Further, due to the factors of the increase in frequency and the reduction in size, the quality of a signal on the electric circuit has been required to be high. For this purpose, to eliminate an influence of a reflection wave due to a characteristic impedance mismatch, the need for matching of characteristic impedances on wires or members on the board has been increased.

BRIEF SUMMARY OF THE INVENTION

To solve the above problem, a major object of the present invention is to provide a wiring board that can easily realize impedance matching in a distributed constant circuit, and electronic equipment, such as a computer, using the wiring board.

According to an embodiment of the present invention, there is provided a wiring board comprising a signal transmission circuit designed as a distributed constant circuit, the signal transmission circuit including:

a first transmission line connecting a first electric component and a second electric component; and a second transmission line connecting the second electric component to a terminator resistor of the distributed constant circuit, at least the first transmission line including a plurality of signal lines arranged in parallel, which transmit an equivalent signal in parallel substantially.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a block diagram of a signal transmission circuit according to an embodiment of the present invention;

FIG. 2 is an enlarged plan view showing first and second transmission lines;

FIG. 3 is a cross-sectional view of a microstrip line;

DETAILED DESCRIPTION OF THE INVENTION

Figure 4:
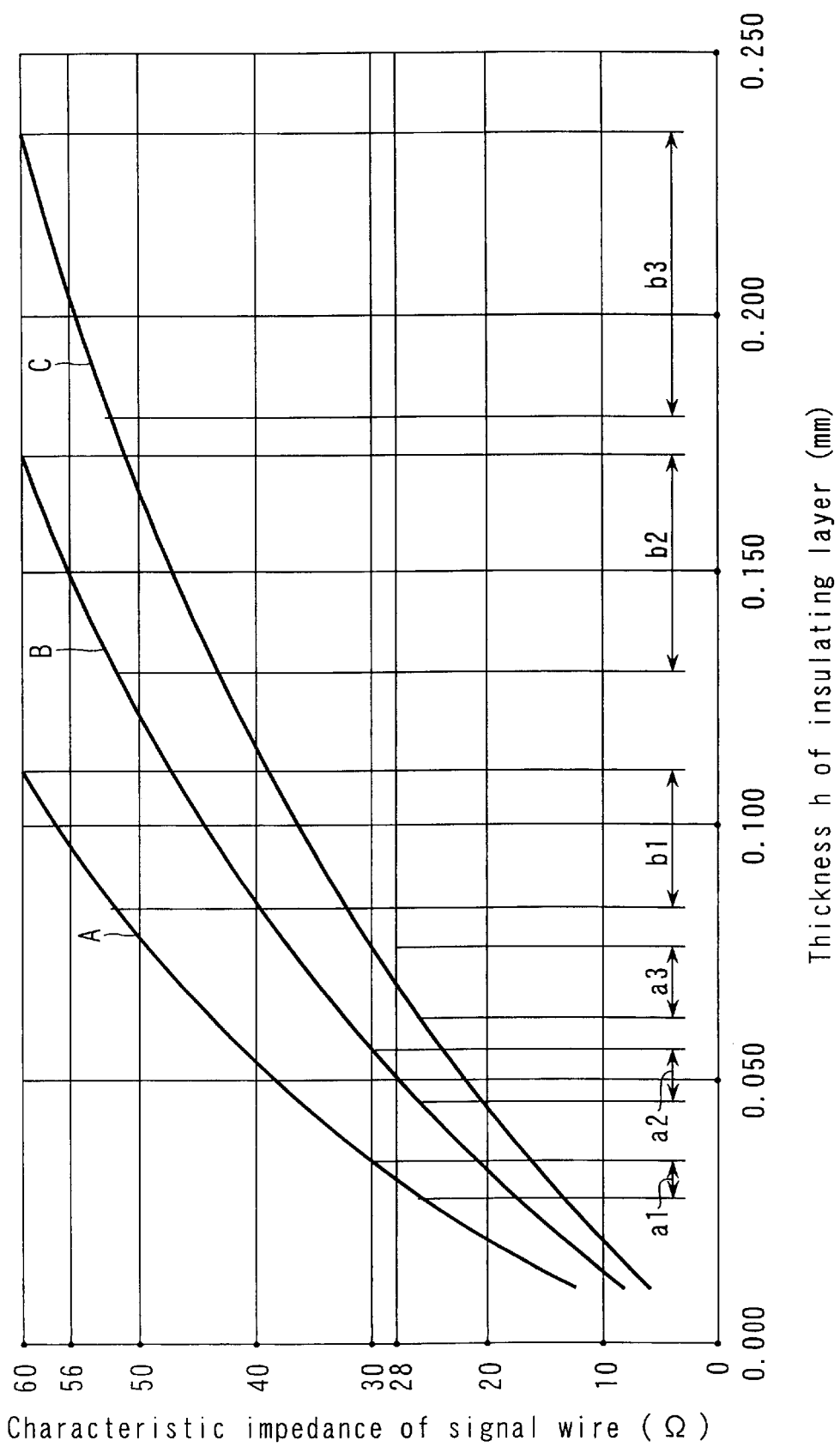
FIG. 4 is a graph showing the relationship between the thickness of an insulating layer and the characteristic impedance of a microstrip line.

Embodiments of the present invention will be described with reference to the accompanying drawings.

FIG. 1 shows a wiring board 1 according to an embodiment of the present invention. The wiring board 1 is a laminated board, comprising a conductive layer including a wiring pattern made of copper or the like and an insulating layer made of epoxy resin or the like. A signal transmission circuit 2, which transmits a signal at high speed, is formed on the wiring board 1. The signal transmission circuit 2 is designed as a distributed constant circuit. For example, it includes a signal source 3, such as a clock generator containing a crystal oscillator that outputs a signal at high frequency of 150 MHz or more, e.g., a clock signal for use in setting an operation timing of an active element, or a semiconductor integrated circuit, e.g., an MPU, which actively transmits a signal. The signal source 3 is a first electric component of the present invention. One end of a first transmission line 4 is connected to the signal source 3.

Another end of the first transmission line 4 is connected to one end of a third transmission line 10 which connects a plurality of memory elements 5, such as DRAMs or SRAMs, mounted on a memory region 6. The memory elements are second electric components. One end of a second transmission line 7 is connected to another end of the third transmission line 10 in the memory region 6. Another end of the second transmission line 7 is connected to a terminator resistor 8. The terminator resistor 8 is connected to a predetermined potential. An area in which the memory elements are arranged with a small pitch is defined as the memory region 6 herein.

As shown in FIG. 2, each of the first transmission line 4 and the second transmission line 7 is formed of two signal lines 9 arranged in parallel. The two signal lines 9 are formed to have the same characteristic impedance. More specifically, they have substantially the same wiring structure, length, width and thickness within error ranges of the respective formation accuracies, such that an equivalent signal is transmitted therethrough in the same period of time.

In general, the characteristic impedance ($Z_0$), the inductance (L) per unit length and the capacitance (C) of a transmission line have the following relationship:

$$Zo = \sqrt{L/C} \tag{1}$$

Therefore, the above formula (1) applies to the characteristic impedances of the first and second transmission lines 4 and 7 and the third transmission line 10 to which no memory element 5 has been connected.

However, since the memory elements 5 are connected to the third transmission line 10 in a small pitch, an effective characteristic impedance ($Z_{0eff}$) in a state where the memory elements 5 are connected must be considered as the characteristic impedance of the memory region 6.

Connecting the memory elements 5 of an input capacitance $C_{in}$ to the third transmission line 10 in a pitch of P, as shown in FIG. 1 is equivalent to connecting an extra capacitance of $C_{in}/P$ per unit length to the third transmission line 10.

The substantial capacitance per unit length of the third transmission line 10 is given by the following formula:

$$C + (C_{in}/P) \tag{2}$$

Therefore, the substantial characteristic impedance $Z_{0eff}$ is represented by the following equation (3).

$$Zo\ eff = \sqrt{\frac{L}{C + (Cin/P)}} \tag{3}$$

For example, if the characteristic impedance of the first and second transmission lines 4 and 7 is 50–70Ω and the pitch of the memory elements 5 is 15–30 mm, the characteristic impedance of the third transmission line 10 is 10–30Ω lower than that of the first and second transmission lines 4 and 7.

To ensure that a signal from the signal source is transmitted at high speed, it is necessary that the characteristic impedances of the signal source 3, the first and second transmission lines 4 and 7, the third transmission line in the memory region 6 and the terminator resistor 8 match with one another.

Therefore, to make the characteristic impedance of the transmission lines 4 and 7 outside the memory region 6 match with that of the memory region 6 on which the memory elements 5 are mounted, it is necessary to design the characteristic impedance of the transmission lines 4 and 7 to be lower than that of the transmission line 10 in the memory region 6.

If the effective characteristic impedance of the memory region 6 is 28Ω, the characteristic impedance of the two signal lines 9 forming each of the transmission lines 4 and 7 is set to 56Ω. Assuming that the characteristic impedances of the two signal lines 9 connected in parallel are $Z_1$ and $Z_2$, the characteristic impedance $Z_0$ of the two signal lines 9 is represented by the following equation:

$$Z_0 = Z_1 \cdot Z_2/(Z_1+Z_2) \tag{4}$$

When the characteristic impedance 56Ω of the signal lines 9 is substituted for $Z_1$ and $Z_2$ in the equation (4), $Z_0$ is 28Ω. Thus, the characteristic impedance of the transmission lines 4 and 7 matches with the effective characteristic impedance of the third transmission line 10 in the memory region 6.

In a microstrip line as shown in FIG. 3, the distance between the signal line 9 and a power source layer 12, i.e., the thickness of an interlayer insulating layer 11 made of epoxy resin is represented by "h", the width of the signal line 9 formed on one surface of the insulating layer 11 is "w" and the thickness thereof is "t". The power source layer 12 or a ground layer 13 is formed on the other surface opposite to the surface on which the signal line 9 is formed.

FIG. 4 is a graph showing the relationship between the characteristic impedance of the signal line 9 and the thickness of the insulating layer 11 on the wiring board 1 shown in FIG. 3. In the graph, the curve A represents the case where the signal line 9 has a thickness t of 0.035 mm and a width w of 0.12 mm, the curve B represents the case where the thickness t is 0.035 mm and the width w is 0.20 mm and the curve C represents the case where the thickness t is 0.035 mm and the width w is 0.28 mm.

In the case of the signal line 9 represented by the curve A, if the characteristic impedance is 28Ω and the tolerance of the characteristic impedance is ±5%, the permissible range of the thickness h of the insulating layer 11 is represented by $a_1$ shown in FIG. 4. The range $a_1$ is between about 0.027 mm and 0.033 mm, and the central value thereof is 0.030 mm. Thus, the thickness h of the insulating layer 11 must be within a range of 0.030±0.003 mm.

In contrast, in the case where the characteristic impedance of the signal line 9 represented by the curve A is 56Ω, if the tolerance of the characteristic impedance is ±5%, the permissible range of the thickness h of the insulating layer 11 is represented by $b_1$ shown in FIG. 4. The range of $b_1$ is between about 0.084 mm and 0.110 mm, and the central value thereof is 0.097 mm. Thus, the thickness h of the insulating layer 11 must be within a range of 0.097±0.013 mm.

Thus, when the characteristic impedance of the signal line 9 is 28Ω, the thickness h of the insulating layer 11 is required to be 0.030 mm with an accuracy of ±0.003 mm. On the other hand, when the characteristic impedance of the signal line 9 is 56Ω, the thickness h of the insulating layer 11 may be 0.097 mm with an accuracy of ±0.013 mm.

In other words, when the characteristic impedance of the signal line 9 is 56Ω, the accuracy required for the thickness h of the insulating layer 11 is about one-fourth of that required in the case where the characteristic impedance is 28Ω (0.013 mm/0.003 mm). In addition, the thickness h of the insulating layer 11 can be increased to 0.097 mm from 0.030 mm. For this reason, the insulating layer 11 can be manufactured easily and efficiently by setting the characteristic impedance of the signal line 9 to 56Ω.

In the case of the signal line 9 represented by the curve B shown in FIG. 4, if the characteristic impedance is 28Ω and the tolerance of the characteristic impedance is ±5%, the permissible range of the thickness h of the insulating layer 11 is represented by $a_2$ in FIG. 4. The range $a_2$ is between about 0.045 mm and 0.055 mm, and the central value thereof is 0.050 mm. Thus, the thickness h of the insulating layer 11 must be within a range of 0.050±0.005 mm.

In contrast, in the case where the characteristic impedance of the signal line 9 represented by the curve B is 56Ω, if the tolerance of the characteristic impedance is ±5%, the permissible range of the thickness h of the insulating layer 11 is represented by $b_2$ in FIG. 4. The range of $b_2$ is between about 0.130 mm and 0.170 mm, and the central value thereof is 0.150 mm. Thus, the thickness h of the insulating layer 11 must be within a range of 0.150±0.020 mm.

Thus, in the case where the width w of the signal line 9 is 0.20 mm, as well as the case where the width w is 0.12 mm, when the characteristic impedance of the signal line 9 is 56Ω, the accuracy required for the thickness h of the insulating layer 11 is about one-fourth of that required in the case where the characteristic impedance is 28Ω (0.020 mm/0.005 mm). In addition, the insulating layer 11 can be about three times as thick as in the case where the characteristic impedance is 28Ω.

In the case of the signal line 9 represented by the curve C shown in FIG. 4, if the characteristic impedance is 28Ω and the tolerance of the characteristic impedance is ±5%, the permissible range of the thickness h of the insulating layer 11 is represented by $a_3$ in FIG. 4. The range $a_3$ is between about 0.062 mm and 0.074 mm, and the central value thereof is 0.069 mm. Thus, the thickness h of the insulating layer 11 must be within a range of 0.069±0.006 mm.

In contrast, in the case where the characteristic impedance of the signal line 9 represented by the curve C is 56Ω, if the tolerance of the characteristic impedance is ±5%, the permissible range of the thickness h of the insulating layer 11 is represented by $b_3$ in FIG. 4. The range of $b_3$ is between about 0.180 mm and 0.240 mm, and the central value thereof is 0.210 mm. Thus, the thickness h of the insulating layer 11 must be within a range of 0.210±0.030 mm.

Thus, in the case where the width w of the signal line 9 is 0.28 mm, when the characteristic impedance of the signal line 9 is 56Ω, the accuracy required for the thickness h of the insulating layer 11 is about one-fifth of that required in the case where the characteristic impedance is 28Ω (0.030 mm/0.006 mm). In addition, the insulating layer 11 can be about 3.4 times as thick as in the case where the characteristic impedance is 28Ω.

As described above, to make the characteristic impedance of the first and second transmission lines 4 and 7 match with the characteristic impedance 28Ω of the signal source 3, the memory region 6 and the terminator resistor 5, the two signal lines 9 having the characteristic impedance of 56Ω are arranged in parallel, thereby forming the first and second transmission lines 4 and 7. As a result, the characteristic impedance of each of the first and second transmission lines 4 and 7 is set to 28Ω.

With the above structure, the permissible accuracy of the thickness h of the insulating layer 11 can be as low as about one-fourth to one-fifth of that in the case where the transmission line is made of one signal line having the impedance of 28Ω. Therefore, the reduction in yield due to thickness variance of the insulating layer 11 can be suppressed, with the result that the insulating layer 11 can be manufactured easily.

In other words, the permissible range of the accuracy of the thickness of the insulating layer 11, which forms the wiring board 1, can be fully expanded, while the characteristic impedance of the signal line 9 forming the transmission lines 4 and 7 of the signal transmission circuit 2 is maintained with an accuracy within the predetermined tolerance.

Further, an insulating layer of the thickness of 0.100 to 0.300 mm is originally adapted to form a transmission line of the characteristic impedance of 50–70Ω, for use in middle or low speed transmission. Therefore, a middle or low speed transmission line can also be formed on the same wiring board 1 in addition to the signal transmission circuit 2 for the high-speed signal of the above embodiment.

Figure 5:
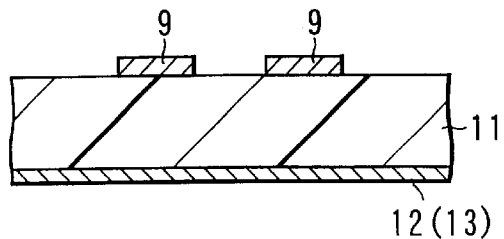
FIG. 5 is an enlarged cross-sectional view showing a main portion of a wiring board on which a first or second transmission line is formed of two microstrip lines.
Figure 6:
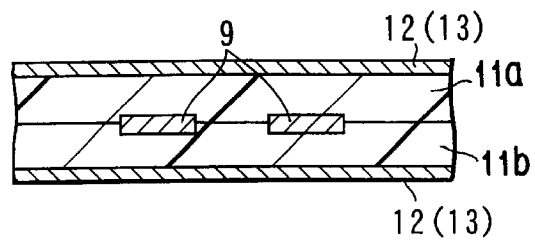
FIG. 6 is an enlarged cross-sectional view showing a main portion of a wiring board on which a first or second transmission line is formed of two strip lines in a form different from that shown in FIG. 5.
Figure 7:
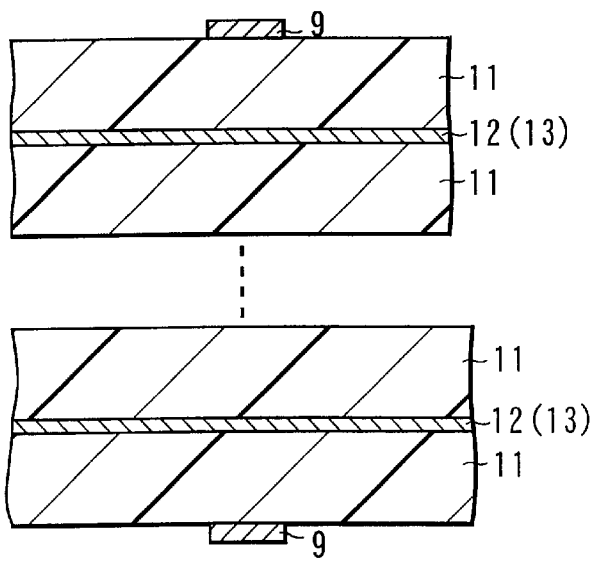
FIG. 7 is an enlarged cross-sectional view showing a main portion of a wiring board on which a first or second transmission line is formed by arranging a microstrip line on each of the main and rear surface of the wiring board.

Furthermore, as shown in FIGS. 5 and 6, each of the first and second transmission lines 4 and 7 may contain two signal lines 9 formed on the same insulating layer 11. FIG. 5 shows a structure in which two microstrip lines are arranged in parallel. FIG. 6 shows a structure in which two strip lines are arranged. In the case of FIG. 5, a power source layer 12 or a ground layer 13 is formed on the lower surface of the insulating layer 11. In the case of FIG. 6, a power source layer 12 or a ground layer 13 is formed on the upper surface of the insulating layer 11a and the lower surface of the insulating layer 11b.

Further, a plurality of signal lines 9 may be formed on different insulating layers 11, as shown in FIGS. 7 to 10. In the structure shown in FIG. 7, one signal line 9, i.e., a microstrip line is formed on each of the main and rear surfaces of the wiring board 1.

Figure 8:
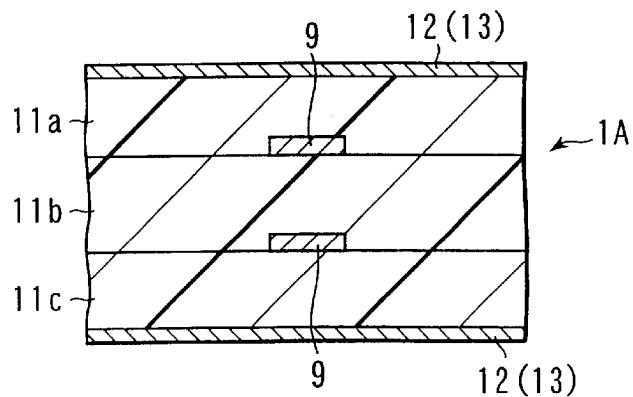
FIG. 8 is an enlarged cross-sectional view showing a main portion of a wiring board on which a first or second transmission line is formed of a dual wire.

In the structure shown in FIG. 8, two signal lines 9 as conductive layers and three insulating layers 11a to 11c are formed between upper and lower power source layers 12 or ground layers 13. One signal line 9 is formed on each of the lower surface of the upper insulating layer 11a and the lower surface of the intermediate insulating layer 11b, thus forming a dual strip line.

Figure 9:
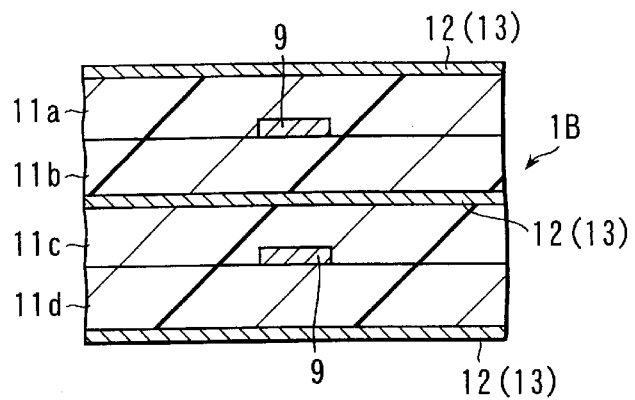
FIG. 9 is an enlarged cross-sectional view showing a main portion of a wiring board on which a first or second transmission line is formed of two dual wires in a form different from that shown in FIG. 8.

In the structure shown in FIG. 9, four insulating layers 11a to 11d are formed between upper and lower power source layers 12 or ground layers 13. Another power source layer 12 or ground layer 13 is interposed between the insulating layers 11b and 11c. Signal lines are formed in the uppermost insulating layer 11a and the third insulating layer 11c from the top, thereby forming a dual strip line.

Figure 10:
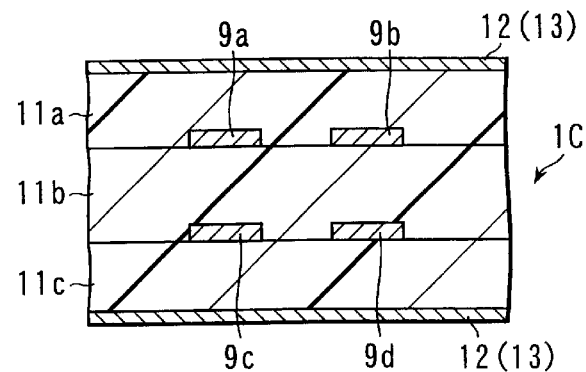
FIG. 10 is an enlarged cross-sectional view showing a main portion of a wiring bored including a differential signal line to which a main portion of the present invention is applied.

In the structure shown in FIG. 10, two dual strip lines shown in FIG. 8 are arranged; that is, four signal lines 9a to 9d are used to form differential signal lines. To form the differential signal lines, the signal lines may be paired in one of the following three combinations: a pair of signal lines 9a and 9b and a pair of signal lines 9c and 9d; a pair of signal lines 9a and 9c and a pair of signal lines 9b and 9d; and a pair of signal lines 9a and 9d and a pair of signal lines 9b and 9c.

As described above, the effective characteristic impedance of the third transmission line 10 is lowered by the memory elements 5 mounted on the memory region 6. To obtain impedance matching in the transmission lines as a whole, the characteristic impedance of the first and second transmission lines 4 and 7 must be the same as the effective value of the characteristic impedance of the third transmission line 10 in the memory region 6, for example, 28Ω.

One of the measures to set the characteristic impedance of the first and second transmission lines 4 and 7 is to reduce the thickness of the insulating layer 11 forming the wiring board 1 on which the transmission lines are formed. However, in this case, it is required to precisely control the thickness of the insulating layer 11 with an accuracy of the order of several microns, which renders the process of manufacturing the wiring board 1 complicated.

The characteristic impedance can be lowered without reducing the thickness of the insulating layer 11 by a measure of widening the signal line forming each of the transmission lines 4 and 7. However, if the width of the signal line is increased, a larger space is required for the signal line. Since, in some case, such a space cannot be ensured in the wiring board 1, this measure is not practical.

Therefore, in the wiring board 1 of this embodiment, each of the transmission lines 4 and 7 outside the memory region 6 is made of the two signal lines 9 arranged in parallel to transmit the same electric signal therethrough. Consequently, the characteristic impedance of the first and second transmission lines 4 and 7 can be accurately set within a permissible range, even if the thickness of the wiring board 1 is not set with high accuracy.

In other words, according to the embodiment of the present invention, a wiring board with a high-speed signal transmission line, serving as a distributed constant circuit, can be stably provided. If the wiring board is applied to electric equipment that handles high-speed signals, a high-speed signal with less noise can be handled with a simple structure. The structure of the invention provides a remarkable effect particularly when it is applied to a portion of a long line.

Figure 11:
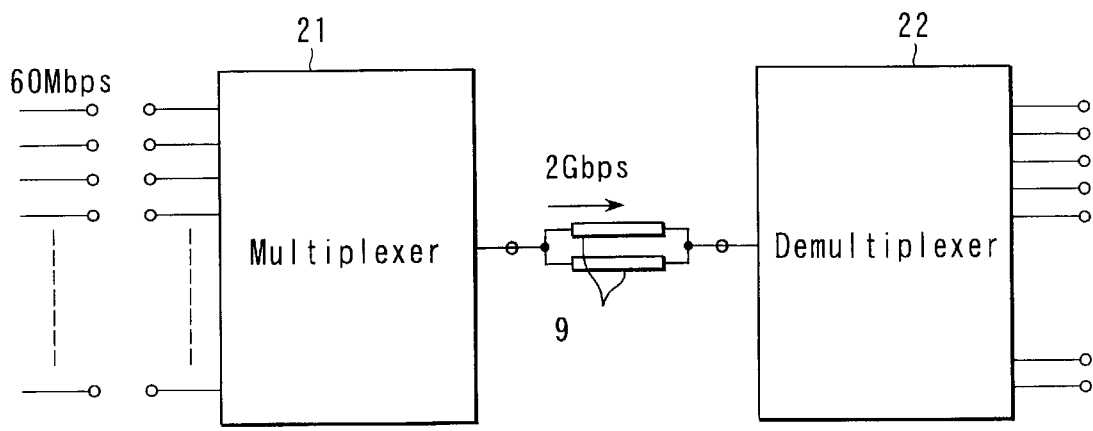
FIG. 11 is a block diagram showing an example in which a main portion of the present invention is applied to electric equipment.

FIG. 11 is a block diagram showing an example in which a main portion of the present invention is applied to electric equipment, such as a router or an exchange. In this embodiment, a multiplexer 21 is connected to a demultiplexer 22 via two signal lines 9 arranged in parallel. Signals of, for example, 60 Mbps are input to the multiplexer 21 in parallel, and converted to a serial signal by the multiplexer 21.

The serial signal is transmitted to the demultiplexer at 2 Gbps by the pair of signal lines 9. The serial signal is converted to parallel signals by the demultiplexer 22, and transmitted to a terminal device (not shown).

The characteristic impedance of the pair of signal lines 9 matches with the characteristic impedances of the multiplexer 21 and the demultiplexer 22. In other words, the characteristic impedance of each of the signal lines 9 is twice as high as the multiplexer 21 and the demultiplexer 22, and an equivalent signal is transmitted in parallel through the transmission lines. Therefore, the impedance of the signal lines of the embodiment matches with that of the multiplexer 21 and the demultiplexer 22.

The present invention is not limited to the above embodiments, but can be variously modified within the scope of the present invention. For example, in the above embodiments, the transmission line contains two signal lines connected in parallel. However, the number of signal lines is not limited two, but three or more signal lines may be arranged in parallel.

In addition, so far as the characteristic impedance values and the electrical lengths of the signal lines are equivalent, the dimensions of the signal lines can be varied, or various wiring structures, such as microstrip lines and strip line, can be combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A wiring board comprising a signal transmission circuit designed as a distributed constant circuit, said signal transmission circuit including:

a first transmission line connecting a first electric component and a second electric component; and a second transmission line connecting the second electric component to a terminator resistor of the distributed constant circuit, at least the first transmission line including a plurality of signal lines arranged in parallel to transmit an equivalent signal substantially in parallel.

2. A wiring board according to claim 1, wherein the second transmission line includes in all region thereof a plurality of signal lines arranged in parallel, which transmit a signal in parallel.

3. A wiring board according to claim 1, wherein said plurality of signal lines are arranged in a plurality of wiring layers and combined in parallel to each other.

4. A wiring board according to claim 1, wherein said plurality of signal lines are same in shape.

5. A wiring board according to claim 1, wherein said plurality of signal lines are combined in parallel to each other, and have same characteristic impedance value and require same time to transmit a signal.

6. Electronic equipment comprising:

a signal source including a clock generator and a processing element;

a memory element temporarily storing an electric signal from the signal source;

a first transmission line electrically connecting the signal source and the memory element; and a second transmission line connecting the memory element to a terminator resistor for the distributed constant circuit, at least the first transmission line including a plurality of signal lines arranged in parallel to transmit a signal in parallel.

7. Electronic equipment including a wiring board on which circuits are formed, said wiring board comprising a signal transmission circuit designed as a distributed constant circuit including:

a first transmission line connecting a first electric component and a second electric component; and a second transmission line connecting the second electric component to a terminator resistor of the distributed constant circuit, at least the first transmission line including a plurality of signal lines arranged in parallel to transmit a signal in parallel.

* * * * *